United States Patent
Sakaguchi

(10) Patent No.: US 10,321,042 B2
(45) Date of Patent: Jun. 11, 2019

(54) IMAGING APPARATUS AND METHOD FOR CONTROLLING THE SAME FOR FOCUS DETECTION USING FOCUS DETECTION AREA BASED ON DEFOCUS AMOUNT

(71) Applicant: CANON KABUSHIKI KAISHA, Tokyo (JP)

(72) Inventor: Takeshi Sakaguchi, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/595,770

(22) Filed: May 15, 2017

(65) Prior Publication Data
US 2017/0347016 A1 Nov. 30, 2017

(30) Foreign Application Priority Data

May 24, 2016 (JP) .................. 2016-103717

(51) Int. Cl.
| | | |
|---|---|---|
| G02B 7/09 | (2006.01) | |
| G02B 7/28 | (2006.01) | |
| G02B 7/34 | (2006.01) | |
| H04N 5/232 | (2006.01) | |
| H04N 5/235 | (2006.01) | |

(Continued)

(52) U.S. Cl.
CPC ........... H04N 5/23212 (2013.01); G02B 7/09 (2013.01); G02B 7/285 (2013.01); H04N 5/2351 (2013.01); H04N 5/23219 (2013.01); G02B 7/34 (2013.01); H01L 27/14627 (2013.01); H01L 27/14806 (2013.01)

(58) Field of Classification Search
CPC . G02B 7/09; G02B 7/285; G02B 7/34; G02B 7/343; G02B 7/346; H04N 5/23219; H04N 5/2351; H04N 5/23212; H04N 5/3696; H04N 5/374; H04N 17/002; G03B 13/36
See application file for complete search history.

(56) References Cited

U.S. PATENT DOCUMENTS

| | | | | |
|---|---|---|---|---|
| 6,816,199 B1 * | 11/2004 | Ide | ........................... | G03B 3/00 348/315 |
| 2010/0013947 A1 * | 1/2010 | Oikawa | .................. | G03B 13/36 348/222.1 |

(Continued)

FOREIGN PATENT DOCUMENTS

JP 2010-160271 A 7/2010

*Primary Examiner* — Nicholas G Giles
(74) *Attorney, Agent, or Firm* — Cannon USA, Inc., IP Division

(57) ABSTRACT

An imaging apparatus capable of obtaining a focus detection result from a focus detection area in which an object is more appropriately captured during focus detection using a signal from an image sensor is provided. The imaging apparatus includes an image sensor configured to periodically capture an image, the image sensor including a plurality of pixels each including a plurality of photoelectric conversion units with respect to a microlens, a setting unit configured to set a plurality of focus detection areas, wherein each of the plurality of focus detection areas corresponds to respective areas of the image sensor. The setting unit is configured to provide a plurality of division patterns for forming a plurality of focus detection areas, and switch the division patterns each time an image is captured by the image sensor.

12 Claims, 8 Drawing Sheets

(51) Int. Cl.
 *H01L 27/146* (2006.01)
 *H01L 27/148* (2006.01)

(56) References Cited

U.S. PATENT DOCUMENTS

| | | | | |
|---|---|---|---|---|
| 2010/0194967 A1* | 8/2010 | Amano | ............ | G02B 7/34 348/345 |
| 2011/0134286 A1* | 6/2011 | Inoue | ............ | H04N 5/23212 348/241 |
| 2011/0273602 A1* | 11/2011 | Takamiya | ............ | H04N 5/23212 348/302 |
| 2012/0147227 A1* | 6/2012 | Yoshimura | ............ | G02B 7/346 348/246 |
| 2012/0162492 A1* | 6/2012 | Akamatsu | ............ | G03B 13/36 348/345 |
| 2012/0200725 A1* | 8/2012 | Albu | ............ | H04N 5/23212 348/222.1 |
| 2012/0237193 A1* | 9/2012 | Kawarada | ............ | G02B 7/34 396/95 |
| 2012/0274785 A1* | 11/2012 | Takeuchi | ............ | G01S 3/7864 348/169 |
| 2013/0026349 A1* | 1/2013 | Kinugasa | ............ | H04N 5/3745 250/214 SW |
| 2014/0176785 A1* | 6/2014 | Sambonsugi | ............ | H04N 5/23212 348/350 |
| 2014/0253774 A1* | 9/2014 | Ogura | ............ | H04N 5/361 348/308 |
| 2014/0307134 A1* | 10/2014 | Kanda | ............ | H04N 5/23212 348/280 |
| 2014/0320734 A1* | 10/2014 | Funatsu | ............ | H04N 5/3456 348/349 |
| 2014/0347549 A1* | 11/2014 | Nakamoto | ............ | G02B 7/36 348/349 |
| 2016/0353006 A1* | 12/2016 | Andersen | ............ | H04N 17/002 |
| 2017/0118396 A1* | 4/2017 | Ohnishi | ............ | H04N 5/23212 |

* cited by examiner

IMAGING APPARATUS AND METHOD FOR CONTROLLING THE SAME FOR FOCUS DETECTION USING FOCUS DETECTION AREA BASED ON DEFOCUS AMOUNT

BACKGROUND

Field of Art

The present disclosure relates to an imaging apparatus having a function of performing focus detection by using a signal from an image sensor.

Description of the Related Art

It is known that when an imaging apparatus such as a digital camera performs automatic focusing (AF), any one of a plurality of focus detection areas arranged in advance is selected and used for AF. Examples of a method for selecting a focus detection area include a method for preferentially selecting a focus detection area in which there is likely to be a main object, like a screen center, and a method for preferentially selecting a focus detection area from which a focus detection result on a nearer side is obtained.

If focus detection areas are discretely arranged, the possibility for an intended object to fall outside the focus detection areas increases. Therefore, focus detection areas are desirably arranged at a high density. However, if the focus detection areas are reduced in size to increase the density, sufficient focus detection accuracy may not be obtained depending on the condition.

Japanese Patent Application Laid-Open No. 2010-160271 discusses a configuration to include a plurality of patterns (division patterns) of a plurality of divided areas into which a line sensor of a secondary image-forming optical system is divided, and switch the division patterns to increase the arrangement density of the focus detection areas. Japanese Patent Application Laid-Open No. 2010-160271 also discusses a configuration to perform focus detection by using all the division patterns during low-speed continuous imaging, and perform focus detection by switching the division patterns each time an image is captured during high-speed continuous imaging. In the low-speed continuous imaging, time available for AF per frame is long. In the high-speed continuous imaging, the time available for AF is short.

However, the configurations discussed in Japanese Patent Application Laid-Open No. 2010-160271 are predicated on focus detection using the line sensor of the secondary image-forming optical system. Such configurations do not take account of, for example, focus detection using a signal from an image sensor that generates an image for display or recording during capturing of a moving image.

SUMMARY

The present disclosure is directed to an imaging apparatus capable of obtaining a focus detection result from a focus detection area in which an object is more appropriately captured during focus detection using a signal from an image sensor.

According to an aspect of an embodiment, an imaging apparatus includes an image sensor configured to periodically capture an image, the image sensor including a plurality of pixels each including a plurality of photoelectric conversion units with respect to a microlens, a setting unit configured to set a plurality of focus detection areas, wherein each of the plurality of focus detection areas corresponds to respective areas of the image sensor, a focus detection unit configured to detect a defocus amount based on an output signal from the pixels corresponding to the focus detection areas, and a selection unit configured to select a focus detection area for use in focus adjustment based on the defocus amount detected from the plurality of focus detection areas by the focus detection unit. The setting unit is configured to provide a plurality of division patterns for forming a plurality of focus detection areas, and switch the division patterns each time an image is captured by the image sensor.

Further features of the present invention will become apparent from the following description of exemplary embodiments with reference to the attached drawings.

DESCRIPTION OF THE EMBODIMENTS

Exemplary embodiments will be described in detail below with reference to the accompanying drawings.

Figure 1:
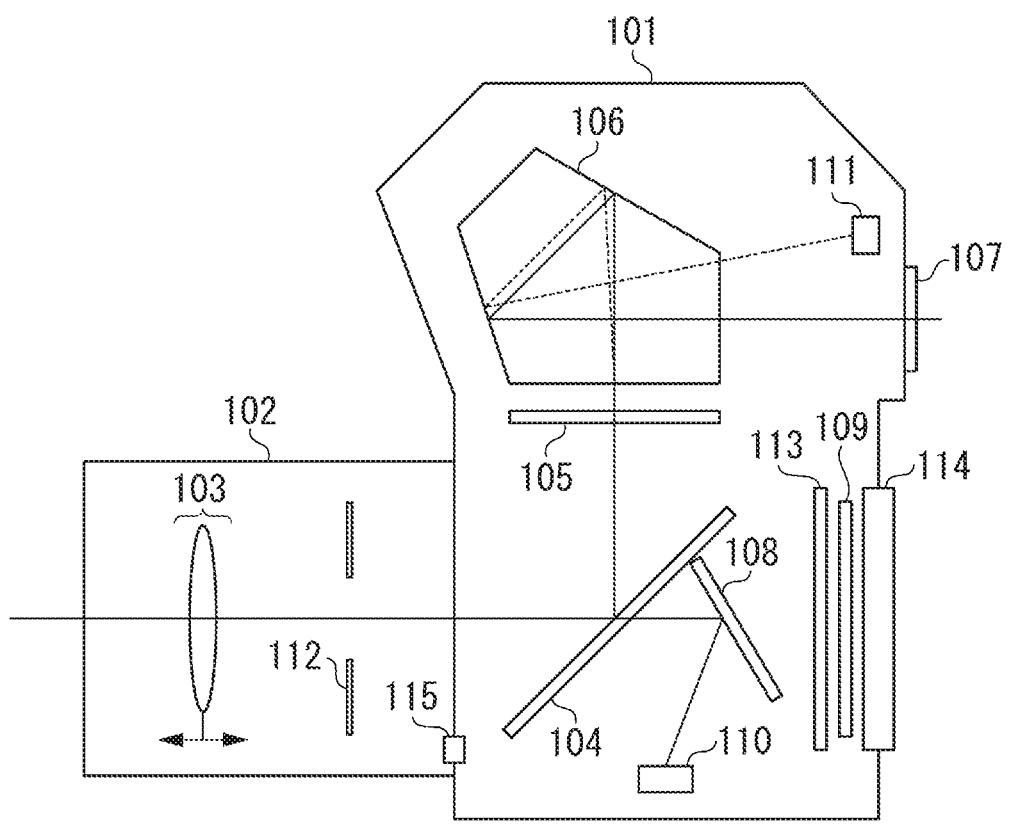
FIG. 1 is a schematic diagram illustrating an imaging apparatus according to a first exemplary embodiment.

FIG. 1 is a schematic diagram illustrating an imaging apparatus according to a first exemplary embodiment. In FIG. 1, an imaging lens 102 is detachably mounted on a front side (object side) of a camera main body 101. The camera main body 101 and the imaging lens 102 are electrically connected via a mount contact group 115. The camera main body 101 and the imaging lens 102 communicate data via contacts.

The imaging lens 102 includes a lens group and a diaphragm 112. The lens group includes a focus lens 103 to be moved in an optical axis direction for focus adjustment. The diaphragm 112 adjusts an amount of light to enter the camera main body 101. There are also provided motors (not illustrated) for driving the focus lens 103 and the diaphragm 112, respectively An imaging optical system is configured to include the lens group and the diaphragm 112.

The camera main body 101 includes an image sensor 109 including a plurality of pixels. The image sensor 109 photoelectrically converts an object image formed by the light having passed through the imaging optical system, and outputs an imaging signal. The image sensor 109 includes a charge-coupled device (CCD) sensor or complementary metal-oxide-semiconductor (CMOS) sensor on which an object optical image having passed through the focus lens 103 is to be formed. The image sensor 109 according to the present exemplary embodiment is configured to obtain an image signal for use in focus detection by a phase difference detection method. In other words, the image sensor 109 is capable of focus detection by an imaging plane phase difference detection method. For example, the image sensor 109 includes a plurality of photoelectric conversion units corresponding to a microlens provided for each pixel, and can obtain a pair of image signals having a parallax from the photoelectric conversion units of the plurality of pixels. A shutter 113 adjusts exposure time of the image sensor 109.

A main mirror 104 including a semitransparent portion is retracted out of an imaging light beam (out of an optical path) during imaging. The main mirror 104 is obliquely set in the imaging light beam (in the optical path) during focus detection. FIG. 1 illustrates a state (mirror-down state) in which the main mirror 104 is inserted into the imaging light beam. In the mirror-down state, the main mirror 104 guides part of the ht beam. having passed through the imaging optical system to a viewfinder optical system including a focus plate 105, a pentaprism 106, and an eyepiece lens 107. In the mirror-down state, the main mirror 104 also guides part of the light beam having passed through the imaging optical system to a light metering unit 111. The light metering unit 111 detects a luminance signal and color difference signals of the object optical image.

A sub mirror 108 is folded and unfolded with respect to the main mirror 104 in synchronization with an operation of the main mirror 104. Part of the light beam having passed through the semitransparent portion of the main mirror 104 is reflected downward by the sub mirror 108 and incident on a focus detection unit 110 of the phase difference detection method, and a focus state is detected by the focus detection unit 110. The focus detection unit 110 includes a secondary image-forming optical system and line sensors including a plurality of pixels which each produce one or more output signal(s). The focus detection unit 110 can obtain a pair of image signals having a parallax from a pair of line sensors.

A display unit 114 displays imaging information and a captured image based on the imaging signal so that the user can observe the imaging information and the captured image.

Figure 2:
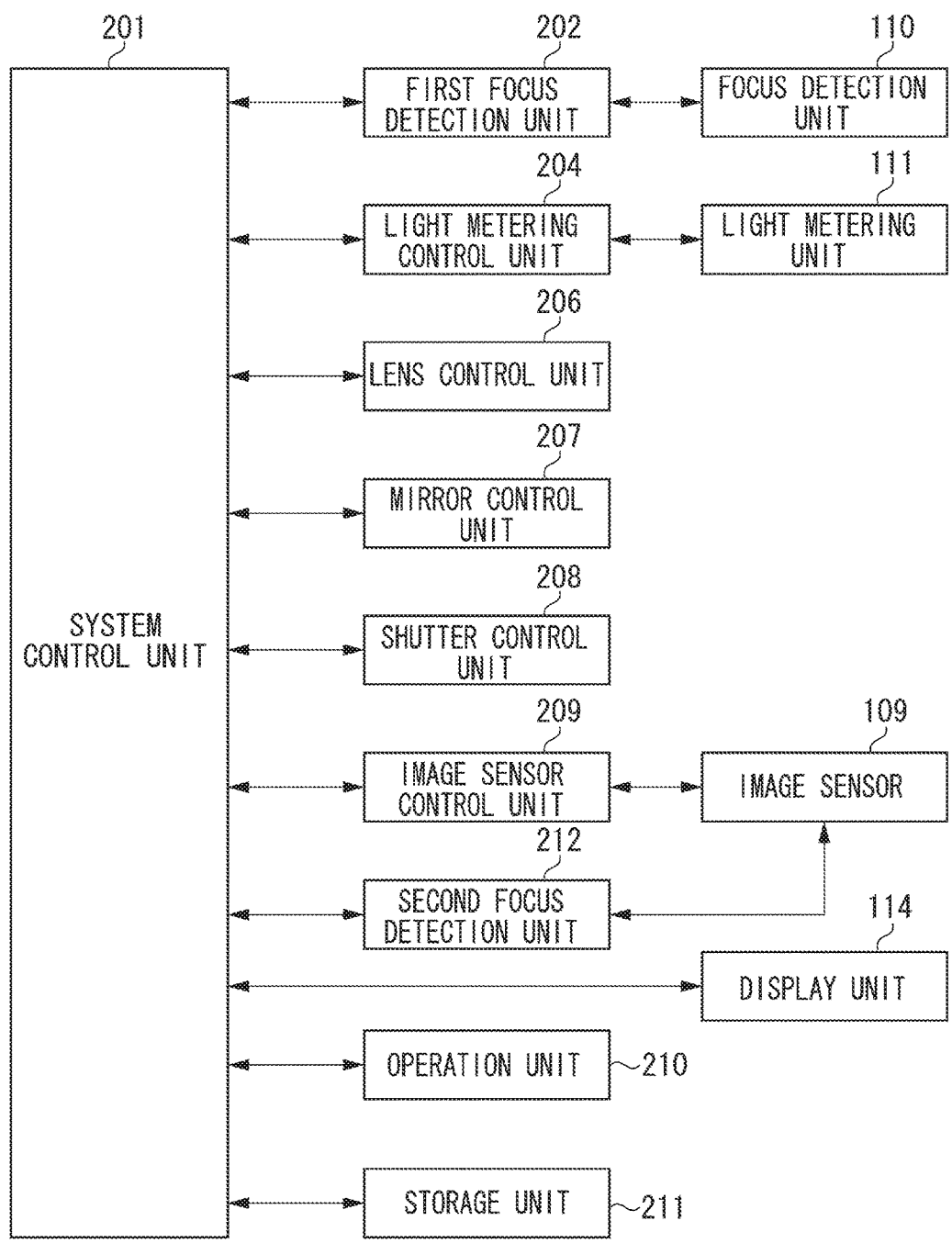
FIG. 2 is a schematic diagram illustrating a configuration example of the imaging apparatus according to the first exemplary embodiment.

Next, a configuration example of the imaging apparatus according to the present exemplary embodiment will be described with reference to the schematic diagram of FIG. 2. In FIG. 2, components similar to those of FIG. 1 are designated by the same reference numerals.

A system control unit 201 includes a central processing unit (CPU) for controlling the entire camera main body 101, and a random access memory (RAM) serving as a storage device. The system control unit 201 appropriately controls an operation of various units to be described below, such as a first focus detection unit 202.

The first focus detection unit 202 is connected to the system control unit 201, and drives the focus detection unit 110. The foregoing line sensors of the focus detection unit 110 convert the light beam incident via the sub mirror 108 into electrical signals, and the first focus detection unit 202 reads the image signals. Based on the image signals, the first focus detection unit 202 calculates a defocus amount of a focus detection area corresponding to each line sensor. The system control unit 201 adjusts focus by determining the driving amount of the focus lens 103 based on the defocus amount output from the first focus detection unit 202, and transmitting a drive command to drive the focus lens 103 to a lens control unit 206 in the imaging lens 102. The lens control unit 206 includes a CPU for controlling the entire imaging lens 102.

A light metering control unit 204 is connected to the system control unit 201, and drives the ht metering unit 111. The light metering unit 111 converts the light beam of the object optical image having passed through the imaging optical system into an electrical signal, and the light metering control unit 204 reads light metering image data. The light metering control unit 204 performs automatic exposure calculation based on the light metering image data, and outputs to result to the system control unit 201. Based on the result of the automatic exposure calculation output from the light metering control unit 204, the system control unit 201 adjusts the amount of light to enter the camera main body 101 by transmitting a drive command to drive the diaphragm 112 to the lens control unit 206. The system control unit 201 further adjusts the exposure time of the image sensor 109 by controlling the shutter 113 via a shutter control unit 208 during a release operation (when an image to be recorded is captured).

A mirror control unit 207 is connected to the system control unit 201. The mirror control unit. 207 drives the main mirror 104 out of the imaging light beam. An image sensor control unit 209 is connected to the system control unit 201. The image sensor control unit 209 drives the image sensor 109, and photoelectrically converts an object image to output the imaging signal to the system control unit 201.

A second focus detection unit. 212 is connected to the system control unit 201. The second focus detection unit 212 obtains image signals for imaging plane phase difference detection from the image sensor 109, and performs focus detection. For example, a plurality of photoelectric conversion units is provided under each microlens corresponding to each pixel of the image sensor 109 as described above. In such a case, the photoelectric conversion units receive and photoelectrically convert light beams having passed through different pupil regions of the imaging optical system to generate a pair of image signals. The second focus detection unit 212 calculates the defocus amount of the focus detection area based on the image signals (the output signal of the image sensor). The system control unit 201 adjusts focus by determining the driving amount of the focus lens 103 based on the defocus amount output from the second focus detection control unit 202 and transmitting a drive command to drive the focus lens 103 to the lens control unit 206 in the imaging lens 102. The focus detection by the second focus detection unit 212 is performed during capturing a moving image to be described below.

An operation unit 210 is connected to the system control unit 201. The operation unit 210 includes operation members for operating the camera main body 101, such as a power switch for turning on/off the power of the camera main body 101 and a release button. If the user operates such switches and buttons, a signal corresponding to the operation is input to the system control unit 201. The release button is connected with a release switch SW1 and a release switch SW2. The release switch SW1 is turned an by the user's first stroke operation (half-press operation). The release switch SW2 is turned on by the user's second stroke operation (full-press operation). A storage unit 211 stores setting values of the camera main body 101.

Moving image capturing processing according to the present exemplary embodiment will be described below with reference to the flowchart of FIG. 3. During capturing a moving image, the image sensor 109 periodically performs imaging in synchronization with a vertical synchronization signal. The moving image capturing processing may be applied to moving image capturing for a live view display in which the captured image is successively displayed on the display unit 114. The moving image capturing processing may be applied to moving image capturing for recording.

In step S301, the system control unit 201 reads setting information to be stored in the storage unit 211 when user setting processing is performed on the camera main body 101. The setting information to be read includes information about a frame rate. In step S302, the system control unit 201 sets a division pattern or patterns of focus detection areas based on the setting information read from the storage unit 211 in step S301 retails of division pattern setting will be described below. The control unit may be configured as a setting unit that sets parameters such as division patterns, focus detection areas, etc.

In step S303, the system control unit 201 determines whether a moving image switch is on. If the moving image switch is on (YES in step S303), the processing proceeds Lo step S304. If the moving image switch is off (NO in step S303), the moving image capturing processing ends. In step S304, the system control unit 201 determines whether to perform moving image servo AF. If the moving image servo AF is to be performed (YES in step S304), the processing proceeds to step S305. If the moving image servo AF is not to be performed (NO in step S304), the processing proceeds to step S307. The moving image servo AF refers to an operation of successively performing focus detection and driving the focus lens 103 to continuously perform a focus adjustment. Whether to perform the moving image servo AF is set when the setting information stored in the storage unit 211 is read and when the user setting processing on the camera main body 101 is performed.

In step S305, the system control unit 201 controls the second focus detection unit 212 to perform focus detection by the imaging plane phase difference detection method. In step S306, the system control unit 201 instructs the lens control unit 206 to drive the focus lens 103 based on a focus detection result obtained in step S305. In step S307, the system control unit 201 determines whether to stop the moving image capturing processing. If the moving image capturing processing is to be continued (NO in step S307), the processing proceeds to step S303. If the moving image capturing processing is to be stopped (YES in step S307), the moving image capturing processing ends.

Figure 4:
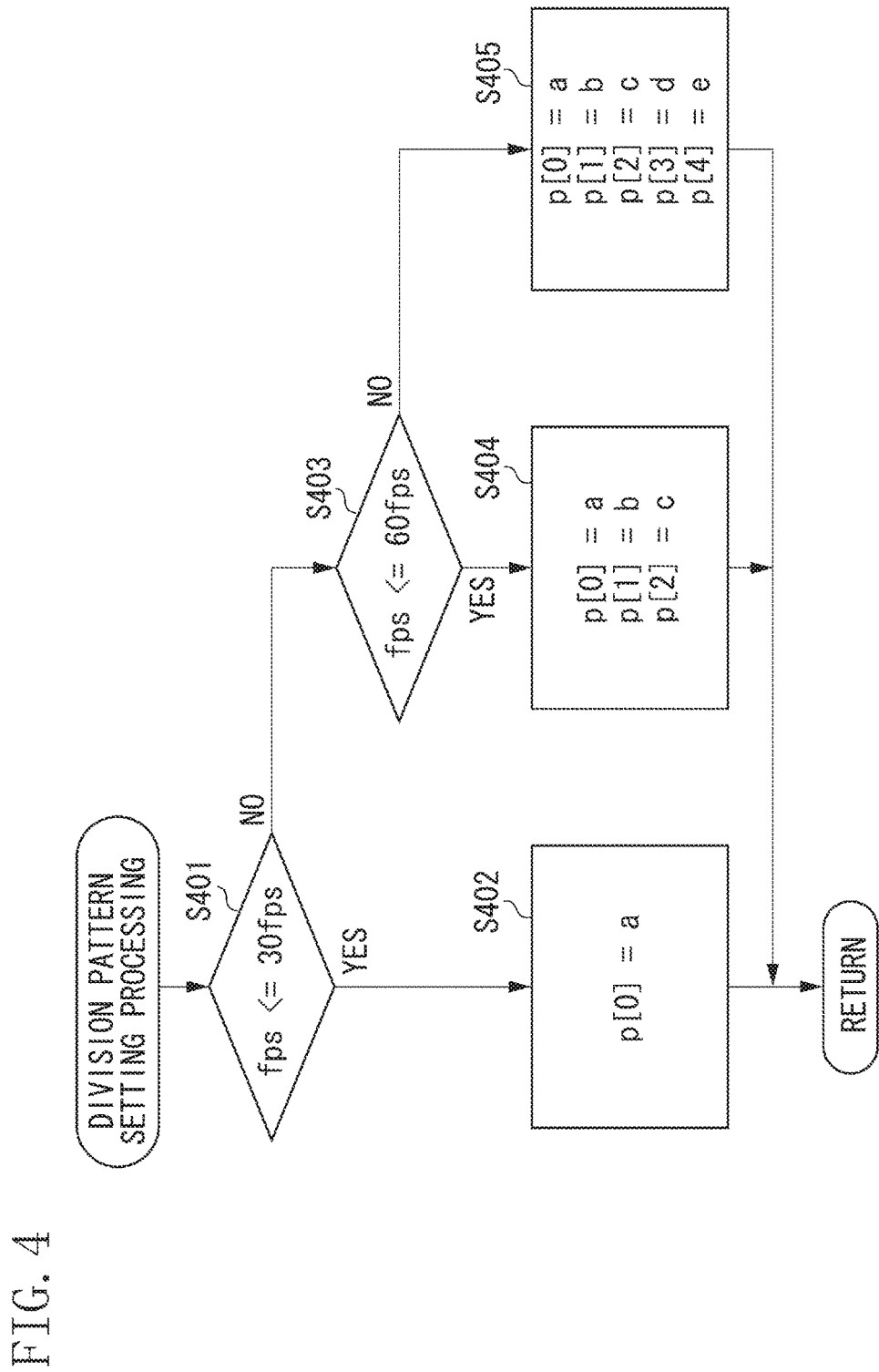
FIG. 4 is a flowchart illustrating division pattern setting processing according to the first exemplary embodiment.
Figure 5A:
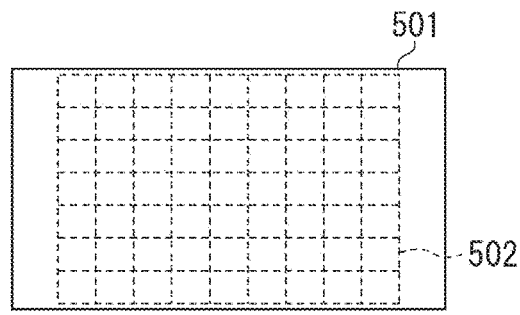
FIGS. 5A to 5E are schematic diagrams illustrating examples of division patterns according to the first exemplary embodiment.
Figure 5B:
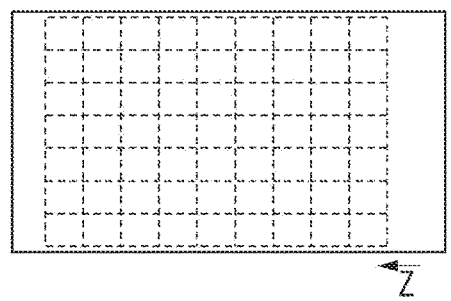
Figure 5C:
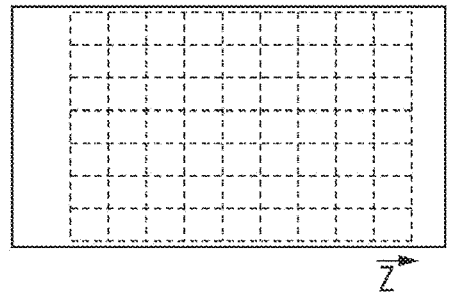
Figure 5D:
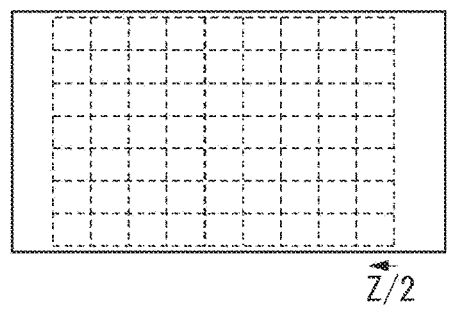
Figure 5E:
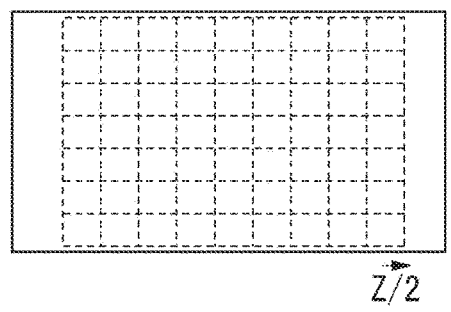

Next, the division pattern setting processing in step S302 according to the present exemplary embodiment will be described with reference to FIGS. 4 and 5A to 5E. FIG. 4 is a flowchart illustrating the division pattern setting processing according to the present exemplary embodiment. FIGS. 5A to 5E are schematic diagrams illustrating examples of the division patterns. FIG. 5A to 5E each illustrate sixty-three focus detection areas 502 which are set so as to correspond to pixel blocks of a recording pixel area 501. The recording pixel area 501 corresponds to nine pixel blocks in a horizontal direction and seven pixel blocks in a vertical direction. Coordinate numbers m (1 to 63) are assigned to the respective focus detection areas 502. The number and division patterns of focus detection areas 502 are not limited to those of the examples of FIGS. 5A to 5E.

In step S401 of FIG. 4, the system control unit 201 determines whether the frame rate of the moving image is lower than or equal to 30 frames per second (fps), based on the information read in step S301. If the frame rate is lower than or equal to 30 fps (YES in step S401), the processing proceeds to step S402. If the frame rate is higher than 30 fps (NO in step S401), the processing proceeds to step S403. In step S402, the system control unit 201 sets a pattern a illustrated in FIG. 5A as a division pattern p.

In step S403, the system control unit 201 determines whether the frame rate of the moving image is lower than or equal to 60 fps, based on the information read in step S301. If the frame rate is lower than or equal to 60 fps (YES in step S403), the processing proceeds to step S404. If the frame rate is higher than 60 fps (NO in step S403), the processing proceeds to step S405. In step S404, the system control unit 201 sets the pattern a and patterns b and c illustrated in FIGS. 5A, 5B, and 5C, respectively, as division patterns p The pattern b is a division pattern obtained by shifting the dividing positions of the pattern a to the left by Z. The pattern c is a division pattern obtained by shifting the dividing positions of the pattern a to the right by Z. The amount of shift Z of the focus detection areas is an amount by which the dividing positions are to be shifted so that the focus detection areas having the same coordinate number m in the respective division patterns overlap each other.

With such a configuration of switching the overlapping focus detection areas in. succession, a moving object can be more reliably captured. In particular, during moving image capturing, such a configuration. can prevent the focus from shifting to an unintended objects In step S405, the system control unit 201 sets the patterns a, b, and c, and patterns d and e illustrated in FIGS. 5A, 5B, 5C, 5D, and 5E, respectively, as division patterns p. The pattern d is a division pattern obtained by shifting the dividing positions of the pattern a to the left by Z/2. The pattern e is a division pattern obtained by shifting the dividing positions of the pattern a to the right by Z/2.

Figure 6A:
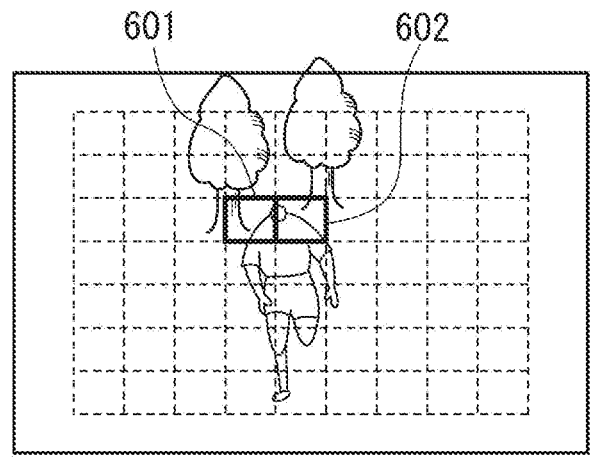
FIGS. 6A to 6C are diagrams illustrating an example of application of division pattern setting according to the first exemplary embodiments.
Figure 6B:
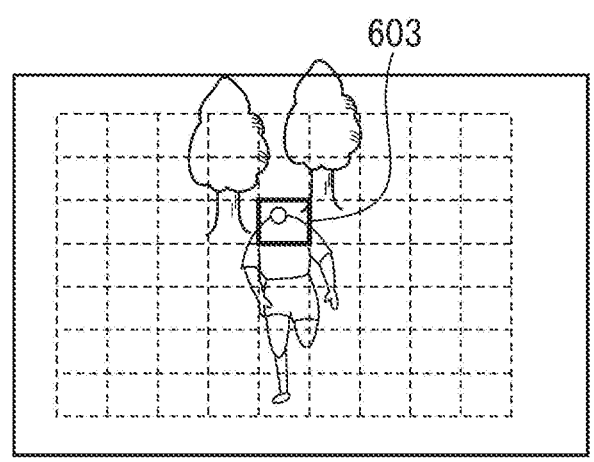
Figure 6C:
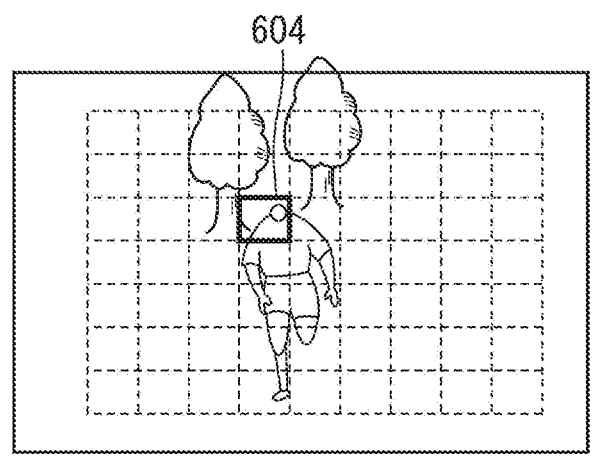

FIGS. 6A to 6C illustrate an example when the foregoing patterns a to c are applied. FIGS. 6A, 6B, and 6C illustrate three consecutive frames, in each of which sixty-three focus detection areas are set by using the patterns a, b, and c, respectively. In other words, a total of 63×3=189 focus detection areas are set in the three frames.

In the example of FIGS. 6A to 6C, a person's face serving as a main object is included in focus detection areas 601 and 602 of FIG. 6A, a focus detection area 603 of FIG. 6B, and a focus detection area 604 of FIG. 6C. Of these, the focus detection area 603 in which the face is included near the center of the field of view is the most desirable focus detection area. If the pattern a is the only division pattern, objects (trees) lying on the far side of the person are included in the focus detection areas 601 and 602, and the focus detection result is that focus is detected closer to behind the main object (person). The focus detection areas 601 and 602 then become less likely to be selected. One or more of the focus detection areas may be selected by a selection unit for use in focus adjustment. The selection unit may be implemented by circuitry or by instructions executed by a general purpose processor, a controller, etc.

As described above, even if there is no appropriate focus detection area in one division pattern, an appropriate focus detection area can be selected by increasing division patterns to set focus detection areas at higher density. If a plurality of division patterns is set, as many frames as the number of patterns need to be captured for one focus detection operation. The present exemplary embodiment provides a configuration to increase division patterns if the frame rate is high to some extent (in the example of FIG. 4, higher than 30 fps). If the frame rate is even higher, or 60 fps, the number of division patterns is further increased, compared to the case of 30 fps.

Figure 7:
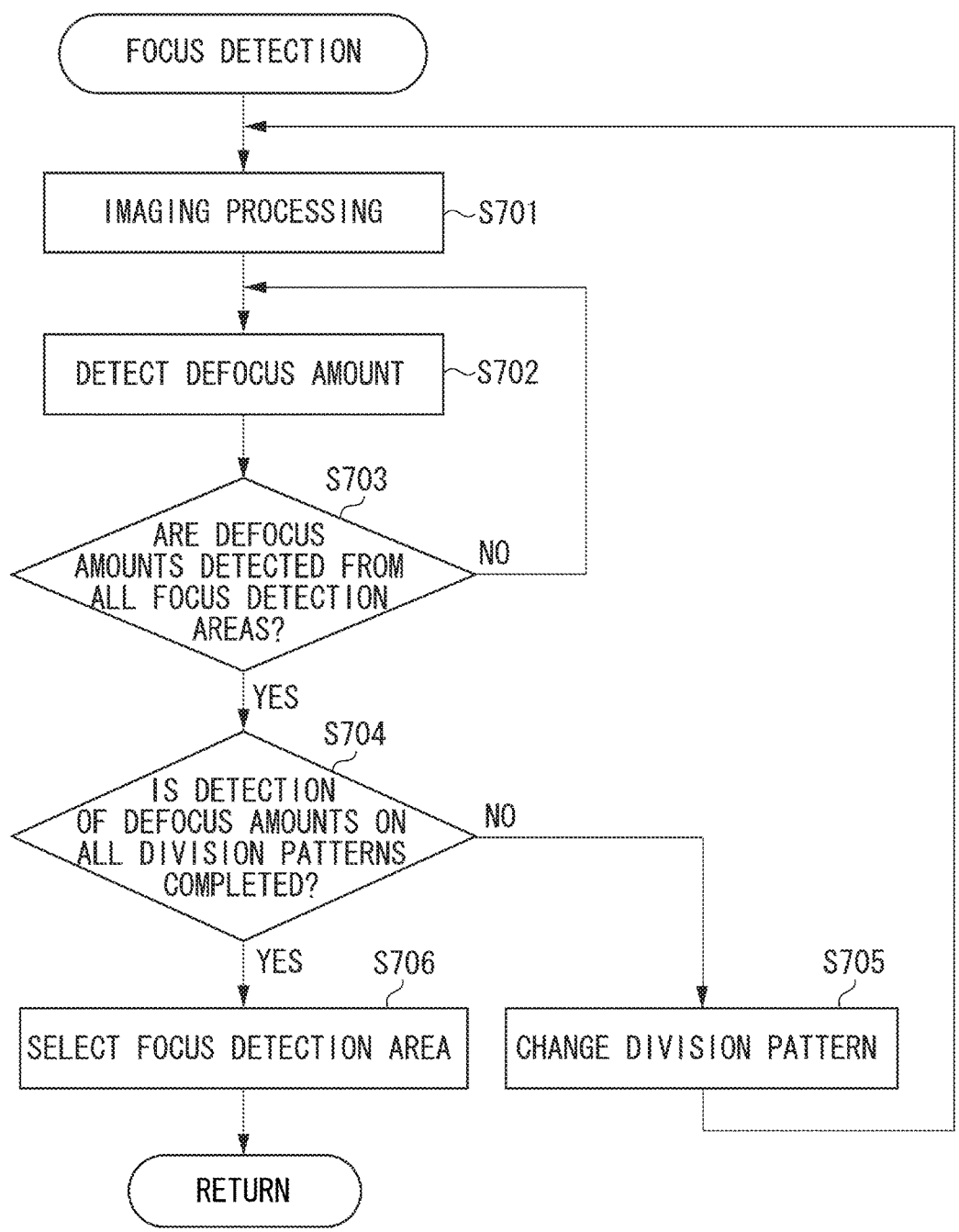
FIG. 7 is a flowchart illustrating focus detection according to the first exemplary embodiments.

Next, the focus detection in step S305 will be described with reference to the flowchart of FIG. 7. In step S701, the system control unit 201 performs one frame of imaging processing to accumulate signal charges in the image sensor 109. In step S702, the system control unit 201 controls the second focus detection unit 212 to obtain. image signals and perform correlation calculation to detect the defocus amount in each of the focus detection areas. In step S703, if the defocus amounts are determined to be detected from all the focus detection areas (in the example of FIGS. 5A. to 5E, 63 focus detection areas) (YES in step S703), the processing proceeds to step S704.

Figure 3:
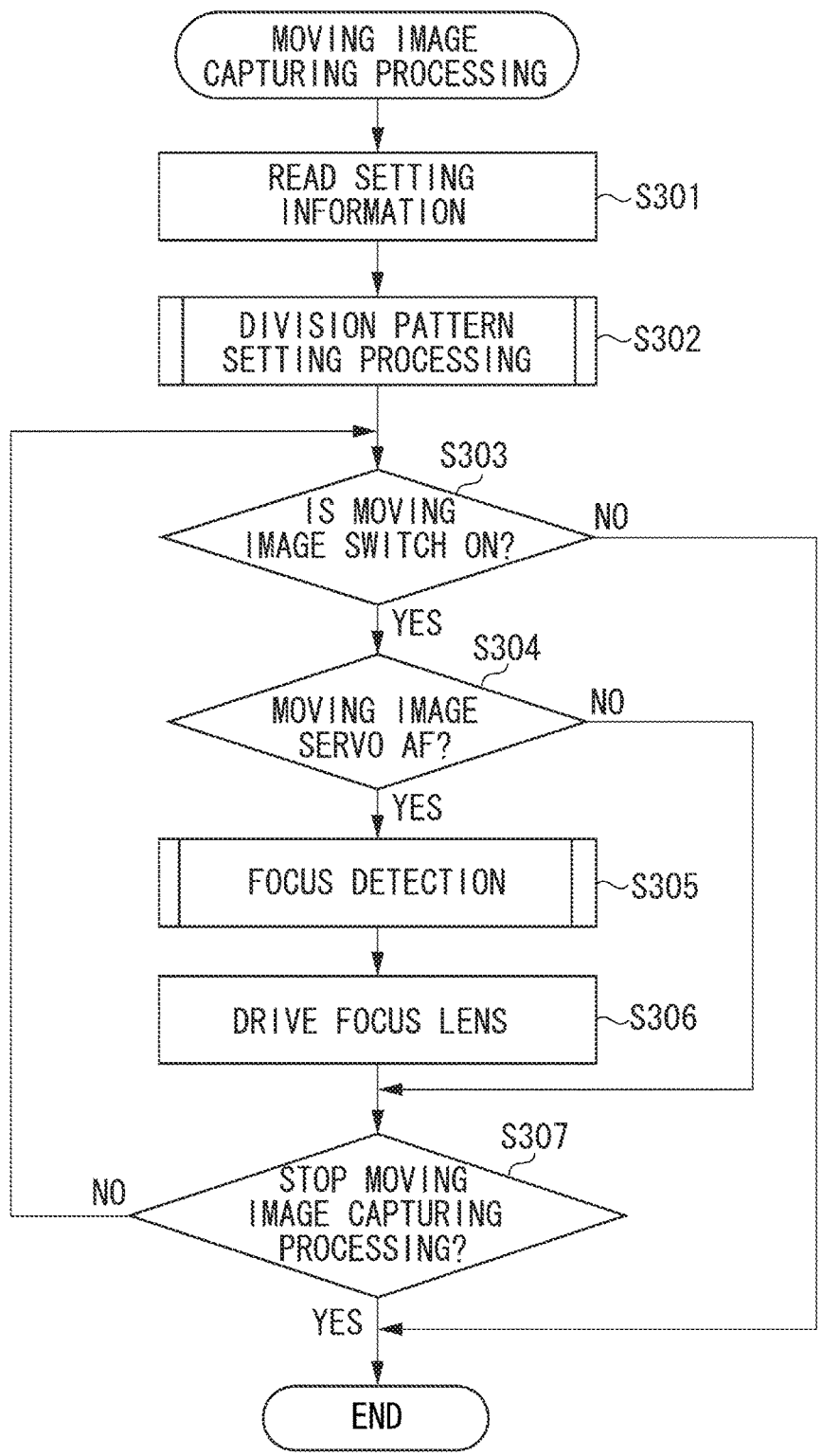
FIG. 3 is a flowchart illustrating moving image capturing processing according to the first exemplary embodiment.

In step S704, the system control unit 201 determines whether the detection of the defocus amounts is completed on all the division pattern(s) set in step S302 of FIG. 3. If there is a division pattern from which the defocus amounts are yet to be detected (NO in step S704), the processing proceeds to step S705. In step S705, the system control unit 201 changes the division pattern. The processing proceeds to step S701. In other words, in steps S701 to S705, the defocus amount is detected from each detection area of all the division pattern(s) set in step S302. If the detection of the defocus amounts is completed on the detection areas of all the division pattern(s) (YES in step S704), the processing proceeds to step S706.

In step S706, the system control unit 201 selects one of the focus detection areas from which the defocus amounts are detected (in the example of FIGS. 5A to 5E, 189 focus detection areas), and stores an index of the focus detection area and the detected defocus amount. Based on the defocus amount, the focus lens 103 is driven in step S306 of FIG. 3. The index is determined by the division pattern p and the coordinate number m of the selected focus detection area.

The focus detection area may be selected by a method for preferentially selecting a focus detection area which a focus detection result on the nearest side is obtained or that is close to the center of the screen from among focus detection areas of which the image signals have a degree of reliability (two-image matching level or degree of reliability based on image sharpness) higher than a predetermined level. A focus detection area in which a focus detection result outstandingly on the near side is obtained may be preferentially selected from among focus detection areas having the same coordinate number m in the respective division patterns, or from among focus detection areas including such ones and adjacent ones. For example, an average of the defocus amounts in the respective intended focus detection areas may be calculated, and a focus detection area in which a defocus amount on the near side larger than the average by more than a predetermined value is obtained may be preferentially selected. The number of focus detection areas to be selected does not necessarily need to be one. The focus lens 103 may be driven based on defocus amounts detected from a plurality of focus detection areas.

As described above, according to the present exemplary embodiment, the focus detection by the imaging plane phase difference detection method is performed by shifting the positions to set focus detection areas with respect to each imaging frame to increase the division patterns of the focus detection areas. Such a configuration is equivalent to arranging focus detection areas at higher density, without reducing the size of the focus detection areas. A focus detection result can thus be obtained from a focus detection area in which the object is more appropriately caught. If the object is a moving one, the object can be more reliably caught by switching t overlapping detection areas in succession like the present exemplary embodiment. In the present exemplary embodiment, to prevent the focus detection from taking long at low frame rates, the division patterns of the focus detection areas are increased if the frame rate is higher than a certain level.

Division pattern setting according to a second exemplary embodiment will be described below. The second exemplary embodiment differs from the first exemplary embodiment in that a focus detection area shift characteristic can be set and that the number of division patterns is changed according to the focus detection area shift characteristic. The second exemplary embodiment may have a configuration similar to that of the first exemplary embodiment except the division pattern setting processing in step S302 of FIG. 3.

Figure 8:
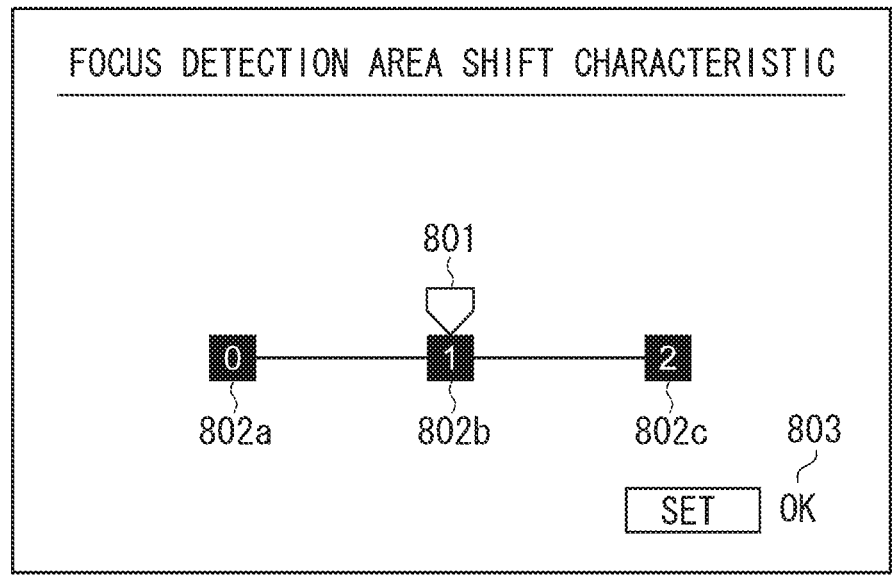
FIG. 8 is a diagram illustrating an example of a setting screen of a focus detection area shift characteristic according to a second exemplary embodiment.

The division pattern setting according to the present exemplary embodiment will be described with reference to FIG. 8. FIG. 8 illustrates an example of a setting screen for a user to set the focus detection area shift characteristic the camera main body 101. For example, the setting screen is displayed on the display unit 114. The focus detection area shift characteristic represents an easiness of switching the focus detection areas according to the detected defocus amount in an operation mode in which focus detection is performed by using a plurality of focus detection areas. In the example of FIG. 8, an index 801 indicates the current setting value. Any one of values 802a, 802b, and 802c can be selected. The value 802a indicates that focus detection areas are less easy to switch. The value 802c indicates that focus detection areas are easy to switch. If the user sets the index 801 at a desired value and presses a button 803, the setting value is stored in the storage unit 211. The setting of the focus detection area shift characteristic is not limited to the example of FIG. 8.

An example of the division pattern setting will be described. If the value 802a is set, the system control unit 201 sets the pattern a described in the first exemplary embodiment as a division pattern D. If the value 802b is set, the system control unit 201 sets the patterns a, b, and c described in the first exemplary embodiment as division patterns p. If the value 802c is set, the system control unit 201 sets the patterns a, b, c, d, and e described in the first exemplary embodiment as division patterns p.

As described above, if a plurality of division patterns is set, frames as many as the number of patterns need to be captured for one focus detection operation. If the easiness of switching the focus detection areas is set to be low and the number of division patterns is increased, focus detection takes unnecessarily long. On the other hand, if the easiness of switching the focus detection areas is set to be high, it is desirable to select a focus detection area in which t object is more reliably captured. In consideration of this, the present exemplary embodiment provides a configuration that the higher the easiness of switching the focus detection areas is set to be, the greater the number of division patterns becomes. The method for setting the division patterns is not limited to the foregoing example.

As described above, according to the present exemplary embodiment, the number of division patterns of the focus detection areas is changed according to the preset easiness of switching the focus detection areas. For example, if the object is a moving one, the easiness of switching the focus detection areas is set to be high to switch the overlapping focus detection areas in succession. A focus detection result can thus be obtained from a focus detection area in which the moving object is more appropriately captured.

The division pattern setting according to the first exemplary embodiment and the division pattern setting according to the second exemplary embodiment may be used in combination. For example, the number of division patterns may be changed based on both the frame rate and the focus detection area shift characteristic.

The exemplary embodiments are described above. However, the present invention is not limited to such exemplary embodiments, and various changes and modifications may be made without departing from the gist thereof.

According to the foregoing exemplary embodiments, a focus detection result can be obtained from a focus detection area in which the object is more appropriately captured during focus detection using a signal from the image sensor.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described. embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent. Application No. 2016-103717, filed May 24, 2016, which is hereby incorporated by reference herein in its entirety.

What is claimed is:

1. An imaging apparatus comprising:
an image sensor configured to periodically capture an image, the image sensor including a plurality of pixels each including a plurality of photoelectric conversion units with respect to a microlens;
a processor; and
a memory storing instructions that when executed by the processor, cause the processor to perform operations comprising:
setting a plurality of focus detection areas, wherein each of the plurality of focus detection areas corresponds to respective areas of the image sensor,
detecting a defocus amount based on an output signal from the pixels corresponding to the focus detection areas, and
selecting a focus detection area for use in focus adjustment based on the defocus amount detected from the plurality of focus detection areas,
wherein setting comprises providing a plurality of division patterns for forming a plurality of focus detection areas, and switching the division patterns each time an image is captured by the image sensor,
wherein the plurality of division patterns includes division patterns that are shifted with respect to one another by a shift amount such that the focus detection areas having same coordinate number overlap each other, and
wherein number of the division patterns switched each time the image is captured by the image sensor is varied depending on a capturing condition.

2. The imaging apparatus according to claim 1, wherein the focus detection areas formed with the plurality of division patterns overlap each other.

3. The imaging apparatus according to claim 1,
wherein detecting comprises detecting the defocus amount from each of the focus detection areas formed with the plurality of division patterns, and
selecting comprises selecting the focus detection area for use in focus adjustment from among the focus detection areas formed with the plurality of division patterns.

4. The imaging apparatus according to claim 1, wherein the capturing condition is a frame rate of the image sensor, and wherein the number of division patterns varies depending on a frame rate of the image sensor.

5. The imaging apparatus according to claim 4, wherein if the frame rate of the image sensor has a first value, the number of division patterns is greater than if the frame rate has a second value lower than the first value.

6. The imaging apparatus according to claim 4, wherein the plurality of division patterns is set if the frame rate of the image sensor is higher than a predetermined value.

7. An imaging apparatus comprising:
an image sensor configured to periodically capture an image, the image sensor including a plurality of pixels each including a plurality of photoelectric conversion units with respect to a microlens;
a processor; and
a memory storing instructions that when executed by the processor, cause the processor to perform operations comprising:
setting a plurality of focus detection areas, wherein each of the plurality of focus detection areas corresponds to respective areas of the image sensor,
detecting a defocus amount based on an output signal from the pixels corresponding to the focus detection areas, and
selecting a focus detection area for use in focus adjustment based on the defocus amount detected from the plurality of focus detection areas,
wherein setting comprises providing a plurality of division patterns for forming a plurality of focus detection areas, and switching the division patterns each time an image is captured by the image sensor,
wherein an easiness of switching the selected focus detection area is settable, and
wherein if the easiness of switching the focus detection area is set to a first setting, the number of division patterns is greater than if the easiness of switching the focus detection area is set to a second setting at which the focus detection area is less easy to switch than at the first setting.

8. The imaging apparatus according to claim 1,
wherein predetermined numbers of focus detection areas are formed with the plurality of division patterns in both a horizontal direction and a vertical direction, respectively, and
wherein selecting comprises selecting the focus detection area for use in focus detection based on the defocus amounts of the focus detection areas at same coordinates and adjacent focus detection areas in the plurality of division patterns.

9. The imaging apparatus according to claim 8, wherein selecting further comprises calculating an average of the defocus amounts of the focus detection areas at the same coordinates and adjacent focus detection areas in the plurality of division patterns, and preferentially selecting a focus detection area in which a defocus amount on a near side of the average by a predetermined value is detected from among the focus detection areas.

10. An imaging apparatus comprising:
an image sensor including a plurality of pixels capable of photoelectrically converting light beams having passed through different pupil regions of an imaging optical system to output a pair of focus detection signals;
a processor; and
a memory storing instructions that when executed by the processor, cause the processor to perform operations comprising:
setting a plurality of focus detection areas, wherein each of the plurality of focus detection areas corresponds to respective areas of the image sensor;
detecting a defocus amount based on the focus detection signals output from the pixels corresponding to the focus detection areas; and
selecting a focus detection area for use in focus adjustment based on the defocus amount detected from the plurality of focus detection areas,
wherein setting comprises providing a plurality of division patterns for forming a plurality of focus detection areas, and switching the division patterns each time an image is captured by the image sensor,
wherein the plurality of division patterns includes division patterns that are shifted with respect to one another by a shift amount such that the focus detection areas having same coordinate number overlap each other, and
wherein number of the division patterns switched each time the image is captured by the image sensor is varied depending on a capturing condition.

11. A method for controlling an imaging apparatus including an image sensor configured to periodically capture an image, the image sensor including a plurality of pixels each including a plurality of photoelectric conversion units with respect to a microlens, the method comprising:
setting a plurality of focus detection areas, wherein each of the plurality of focus detection areas corresponds to respective areas of the image sensor;
detecting a defocus amount based on an output signal from the pixels corresponding to the focus detection areas; and
selecting a focus detection area for use in focus adjustment based on the defocus amount detected from the plurality of focus detection areas,
wherein the setting includes providing a plurality of division patterns for forming a plurality of focus detection areas, and switching the division patterns each time an image is captured by the image sensor,
wherein the plurality of division patterns includes division patterns that are shifted with respect to one another by a shift amount such that the focus detection areas having same coordinate number overlap each other, and
wherein number of the division patterns switched each time the image is captured by the image sensor is varied depending on a capturing condition.

12. A method for controlling an imaging apparatus including an image sensor including a plurality of pixels capable of photoelectrically converting light beams having passed through different pupil regions of an imaging optical system to output a pair of focus detection signals, the method comprising:
setting a plurality of focus detection areas, wherein each of the plurality of focus detection areas corresponds to respective areas of the image sensor;
detecting a defocus amount based on the focus detection signals output from the pixels corresponding to the focus detection areas; and
selecting a focus detection area for use in focus adjustment based on the defocus amount detected from the plurality of focus detection areas,
wherein the setting includes providing a plurality of division patterns for forming a plurality of focus detection areas, and switching the division patterns each time an image is captured by the image sensor,
wherein the plurality of division patterns includes division patterns that are shifted with respect to one another by a shift amount such that the focus detection areas having same coordinate number overlap each other, and
wherein number of the division patterns switched each time the image is captured by the image sensor is varied depending on a capturing condition.

* * * * *